(12) United States Patent
Ooi et al.

(10) Patent No.: US 6,998,308 B2
(45) Date of Patent: Feb. 14, 2006

(54) SUBSTRATE FOR CARRYING A SEMICONDUCTOR CHIP AND A MANUFACTURING METHOD THEREOF

(75) Inventors: Kiyoshi Ooi, Nagano (JP); Yasuyoshi Horikawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 88 days.

(21) Appl. No.: 10/693,216

(22) Filed: Oct. 24, 2003

(65) Prior Publication Data

US 2004/0087058 A1     May 6, 2004

(30) Foreign Application Priority Data

Oct. 29, 2002    (JP)   .............................. 2002-314695

(51) Int. Cl.
*H01L 21/8242*     (2006.01)

(52) U.S. Cl. ...................................... 438/253; 438/254

(58) Field of Classification Search ................ 438/253, 438/254
See application file for complete search history.

(56) References Cited

U.S. PATENT DOCUMENTS

| 6,407,929 B1 * | 6/2002 | Hale et al. ................... 361/763 |
| 6,873,038 B1 * | 3/2005 | Shioga et al. ................ 257/686 |
| 6,897,544 B1 * | 5/2005 | Ooi et al. .................... 257/532 |
| 2002/0070400 A1 * | 6/2002 | Shibuya et al. .............. 257/296 |

FOREIGN PATENT DOCUMENTS

| JP | 2001 068858 | 3/2001 |
| JP | 2001 274034 | 10/2001 |

* cited by examiner

*Primary Examiner*—David S. Blum
(74) *Attorney, Agent, or Firm*—Ladas & Parry LLP

(57) ABSTRACT

A substrate includes a plurality of insulation layers forming a laminated structure and a built-in capacitor formed in the laminated structure, wherein the laminated structure includes a layer of baked organic polysilane.

15 Claims, 8 Drawing Sheets

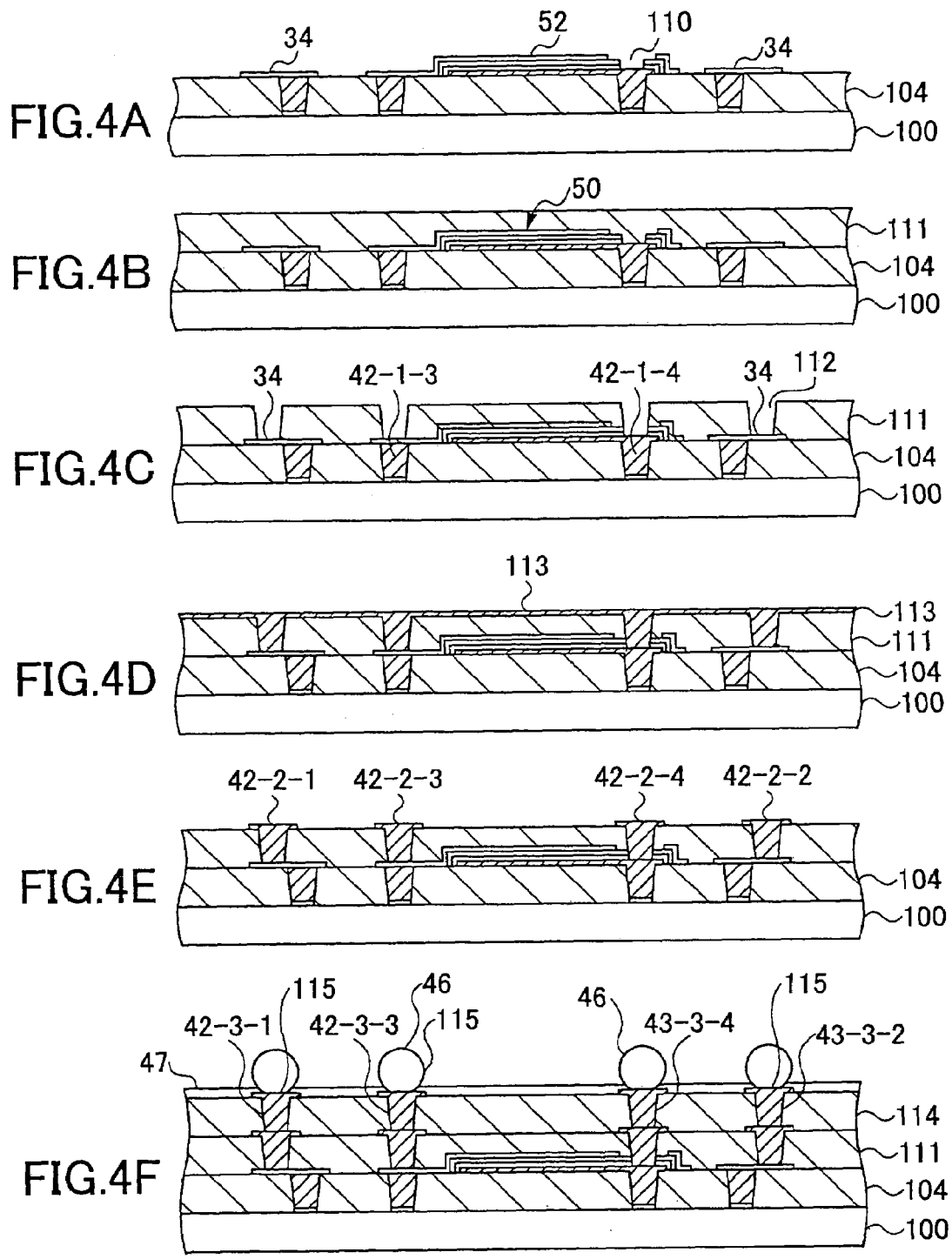

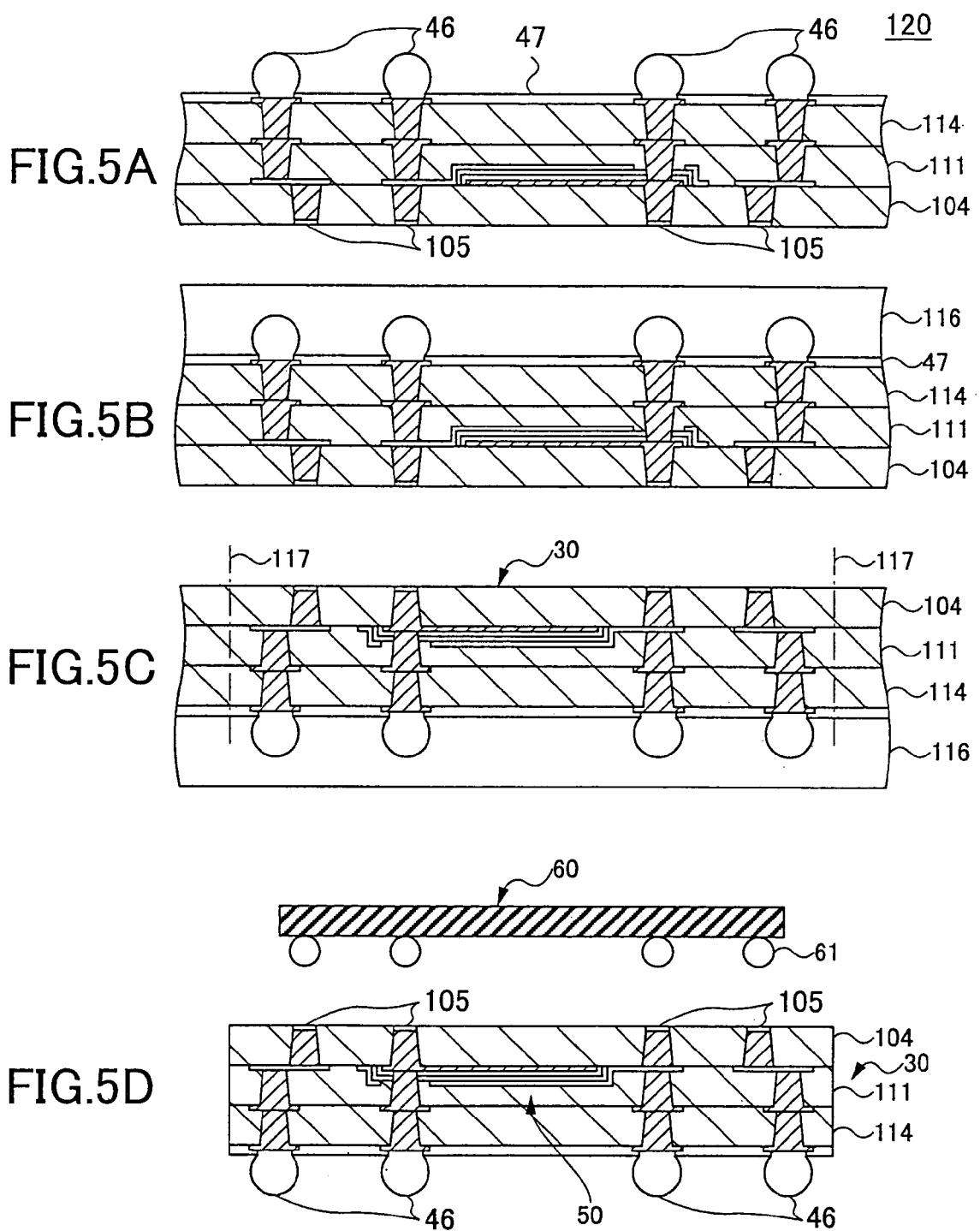

SUBSTRATE FOR CARRYING A SEMICONDUCTOR CHIP AND A MANUFACTURING METHOD THEREOF

CROSS-REFERENCE TO RELATED APPLICATION

The present application is based on Japanese priority application No. 2002-314695 filed on Oct. 29, 2002, the entire contents of which are hereby incorporated by reference.

BACKGROUND OF THE INVENTION

The present invention generally relates to semiconductor devices and more particularly to a substrate for carrying a semiconductor chip and a manufacturing method thereof. Further, the present invention is related to a semiconductor device that uses such a substrate.

With sharp increase of clock frequency in recent advanced semiconductor devices, supply of a stable electric power to semiconductor chip is becoming a paramount problem. In order to deal with this problem, there is a proposal to provide a capacitor on a substrate on which the semiconductor chip is mounted.

FIG. 9 shows a conventional semiconductor device 10.

Referring to FIG. 9, the semiconductor device 10 includes a substrate 11 mounted with a semiconductor chip 12, wherein the substrate 11 includes a substrate body 13 and a decoupling capacitor 14. The decoupling capacitor 14 is provided inside the substrate body 13. The decoupling capacitor 14 includes a dielectric film 16 formed on a silicon substrate 15, and a conductive film 17 is provided further on the dielectric film 16. Reference should be made to Japanese Laid-Open Patent Publication 2001-274034.

In such a semiconductor device 10, which uses a separate capacitor component for the decoupling capacitor 14 in the state that the capacitor 14 is embedded in the substrate body 13, it is difficult to reduce the distance between the decoupling capacitor 14 and the surface on which the semiconductor chip is mounted. In other words, the semiconductor device 10 has a drawback in that reduction of the inductance between the decoupling capacitor 14 and the semiconductor chip 12 mounted on the substrate 11 is difficult. Associated with this drawback, there arises a problem that supply of stabilized electric power, particularly the supply of stabilized voltage, to the semiconductor chip becomes difficult because of the existence of the inductance. This problem becomes particularly serious in recent high-speed semiconductor devices in which the semiconductor chip is driven at a very high clock speed.

In the foregoing prior art, it should be noted that a discrete capacitor component formed separately to the substrate 13 is used for the decoupling capacitor 14, while the decoupling capacitor 14 has to be provided in the form embedded inside the substrate body 13. Because of such a construction, the conventional semiconductor device 10 shown in FIG. 9 has suffered from the problem of complex manufacturing process and the associated problem of high manufacturing cost.

In addition, because the capacitor 14 is formed as a discrete component, a silicon substrate has to be used for the silicon film 15 for supporting the capacitor structure thereon. Associated with the use of such a silicon substrate, there arises a problem that a dicing process becomes necessary for separating the capacitor components 14 formed on a common silicon substrate, while such a dicing process also increases the cost of the substrate 11.

Further, associated with the use of silicon substrate for the silicon film 15, there arises a problem in the semiconductor device 10 in that the decoupling capacitor 14 cannot be formed as thin as desired, and because of this, the thickness of the substrate 11 has been increased. In order to avoid unwanted increase of thickness of the substrate 11, the substrate body 13 is formed with a depression 18 in the example of FIG. 9. However, formation of such a depression 18 makes the manufacturing process and structure of the substrate 10 very complex.

SUMMARY OF THE INVENTION

Accordingly, it is a general object of the present invention to provide a novel and useful substrate to be mounted with a semiconductor chip and a manufacturing method thereof, and further a semiconductor having such a substrate wherein the foregoing problems are eliminated.

Another and more specific object of the present invention is to provide a chip-mounting substrate having a built-in capacitor wherein the thickness, and hence inductance, of the substrate is reduced.

Another object of the present invention is provide a substrate to be mounted with a semiconductor chip, comprising:

a plurality of insulation layers forming a laminated structure, said laminated structure having a mounting surface on which a semiconductor chip is mounted; and a built-in capacitor formed in said laminated structure, said built-in capacitor being integrated with said laminated structure, said built-in decoupling capacitor comprising a dielectric film and a pair of electrode layers sandwiching said dielectric film.

According to the present invention, the capacitor is formed close to the surface on which the semiconductor chip is mounted, and the effect of inductance is minimized. Thereby, a stable power supply becomes possible from the substrate to the semiconductor chip mounted thereon. Because the capacitor, acting as a decoupling capacitor, is formed integral with the substrate, there is no need of mounting a separately manufactured capacitor on the substrate, and the process of manufacturing the semiconductor device is significantly simplified.

By forming the capacitor close to the chip-mounting surface on which a semiconductor chip is mounted, the effect of inductance on the power feeding path for feeding electric power to the semiconductor chip mounted on the substrate is minimized, and stable electric power feeding becomes possible to the semiconductor chip with stabilized voltage even in the case the clock frequency for driving the semiconductor chip is increased.

Another object of the present invention is to provide a method of manufacturing a substrate to be mounted with a semiconductor chip, said substrate comprising plurality of insulation layers forming a laminated structure and a capacitor provided in said laminated structure, said method comprising the steps of:

forming said laminated structure by laminating said insulation films consecutively, said insulation films including a first insulation film and a second insulation film formed on said first insulation film, wherein there are provided the steps, after forming said first insulation layer but before forming said second insulation film, of: forming a first electrode film; forming a dielectric film on said first electrode film; and forming a second electrode film on said dielectric film.

According to the present invention, the capacitor is formed integrally with the laminated structure and a built-in decoupling capacitor is obtained easily and efficiently in the laminated structure.

Particularly, it becomes possible to use a high temperature process at the time of forming the decoupling capacitor by using a baked organic polysilane film for the foregoing insulation layers. It should be noted that a baked organic polysilane film shows excellent endurance to a high temperature process. Further, by using a baked organic polysilane film for the insulation layer, the thermal expansion coefficient of the laminated structure can be adjusted to be generally equal to the thermal expansion coefficient of the semiconductor chip mounted on the substrate by controlling the baking process, and occurrence of thermal stress is minimized between the semiconductor chip and the chip-mounting surface.

Other objects and further features of the present invention will become apparent from the following detailed description when read in conjunction with the attached drawings.

BRIEF DESCRIPTION OF THE DRAWINGS

FIGS. 3A–3G, FIGS. 4A–4F and FIGS. 5A–5D are diagrams showing the manufacturing process of the semiconductor device of FIG. 1;

DETAILED DESCRIPTION OF THE INVENTION

[First Embodiment]

Figure 1:
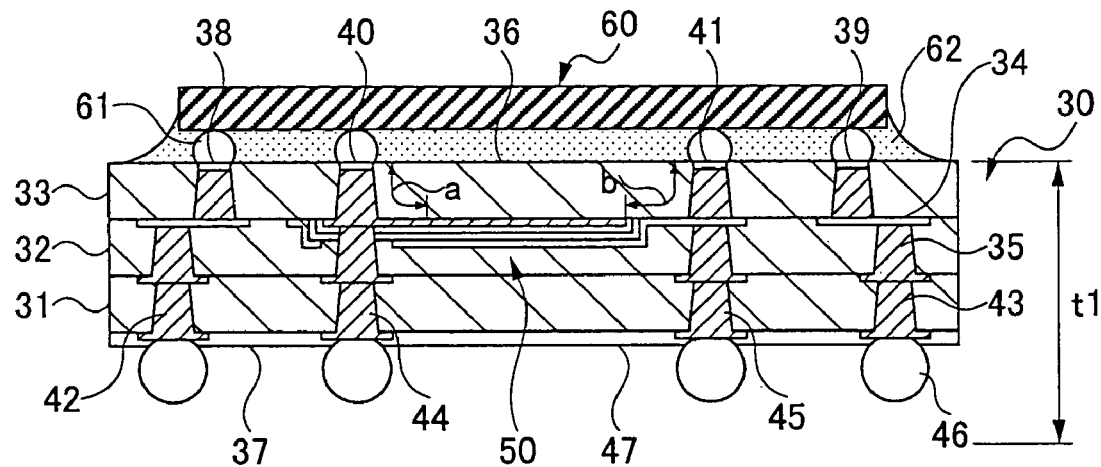
FIG. 1 is a diagram showing the construction of a semiconductor device according to a first embodiment of the present invention.

FIG. 1 shows the construction of a semiconductor device 20 according to a first embodiment of the present invention.

Referring to FIG. 1, the semiconductor device 20 is a so-called ball-grid type device and includes a semiconductor chip 60 flip-chip mounted on a chip-mounting surface 36 of a chip-mounting substrate 30 by way of bumps 61, wherein the semiconductor chip 60 is adhered to the chip-mounting substrate 30 by an underfill resin layer 62. Thereby, it should be noted that the bumps 61 on the bottom surface of the semiconductor chip 60 make an engagement with corresponding terminals exposed at the foregoing surface 36 including signal terminals 38 and 39, a power terminal 40, and a ground terminal 41.

As will be explained later, the chip-mounting substrate 30 is formed by a single-side build-up process and forms a multiplayer circuit substrate including lamination of insulation layers 31, 32 and 33. The substrate 30 is defined by the foregoing chip-mounting surface 36 at the top side thereof and a device-mounting surface 37 at the bottom side thereof, wherein it should be noted that the device-mounting surface 37 is the surface that faces a printed circuit board at the time the semiconductor device is mounted on such a printed circuit board of an electronic apparatus.

In the semiconductor device 20 of FIG. 1, it will be noted that a capacitor 50 is formed between the insulation layer 32 and the insulation layer 33, wherein the capacitor 50 forms a built-in decoupling capacitor and is formed during the build-up process of the substrate 30. More specifically, the capacitor 50 is formed after formation of the insulation layer 33 but before the formation of the insulation layer 32.

At the chip-mounting surface 36, there are exposed the terminals such as the signal terminals 38 and 39, power terminal 40 and the ground terminal 41 as noted before, wherein these terminals are formed with a pattern corresponding to the pattern of the bumps 61 of the semiconductor chip 60. Thereby, it should be noted that each layer includes via-plugs 35 in electrical connection to respective interconnection patterns 34, wherein the via-plugs 35 are aligned to form a conductive structure penetrating through the substrate 30 in the thickness direction thereof. Thereby, the conductive structure may form signal conduction paths 42 and 43 extending respectively from the signal terminals 38 and 39, a power feed path 44 extending from the power terminal 40, and a ground path 45 extending from the ground terminal 41. Further, it will be noted that solder balls 46 are provided to the foregoing conduction paths 42–45 at the mounting surface 37 for mounting on the printed circuit board of an electronic apparatus, and the mounting surface 37 is covered with a solder resist film 47.

The insulation layer 33 constituting the chip-mounting surface 36 is formed of an organic polysilane film processed by pre-baking and post-baking process. More specifically, polymethylphenyl silane having a skeleton of Si atoms and organic substituents at the side chains, is used for the foregoing organic polysilane. The polymethylphenyl silane has photoreactivity to UV radiation and has the feature that the glass transition temperature Tg and the thermal expansion coefficient (CTE) can be adjusted by the temperature of the post baking process. Thereby, the thermal expansion coefficient can be adjusted within the range of 10–100 ppm/K.

Thus, the insulation layer 33 at the side of the chip mounting surface is set to have a thermal expansion coefficient of about 2.6 ppm/K, which is close to the thermal expansion coefficient of the silicon substrate constituting the semiconductor chip. By doing so, the thermal stress between the semiconductor chip 60 and the substrate 30 is minimized in the semiconductor device 10. Further, it should be noted that the baked organic polysilane film thus processed has a Young modulus of 1.2 GPa, a dielectric constant of 2.8, a dielectric loss tangent of 0.005, and an insulation performance of $3-7 \times 10^{13}$.

Figure 8:
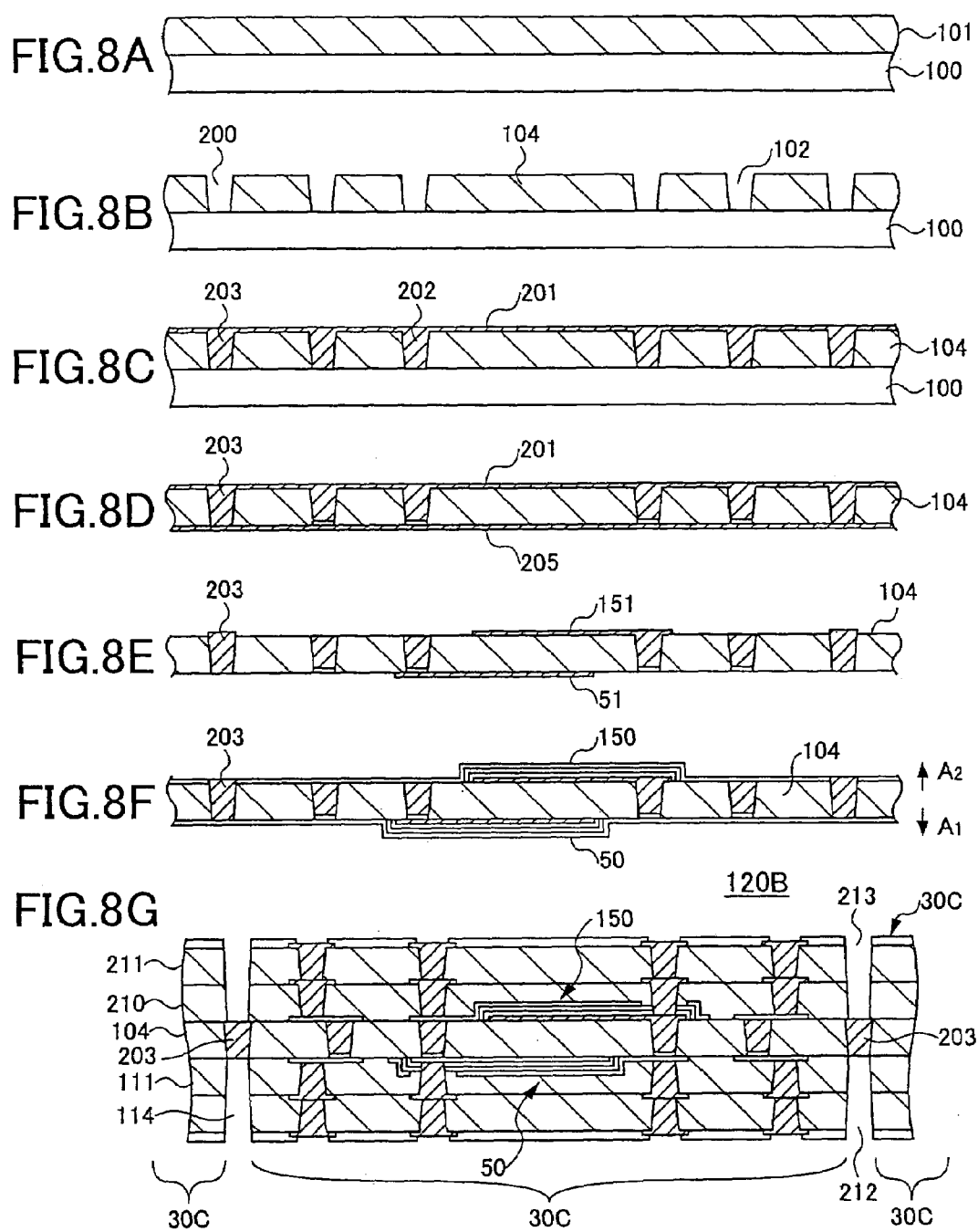
FIGS. 8A–8G are diagrams showing the manufacturing process of the semiconductor device of FIG. 7.
Figure 9:
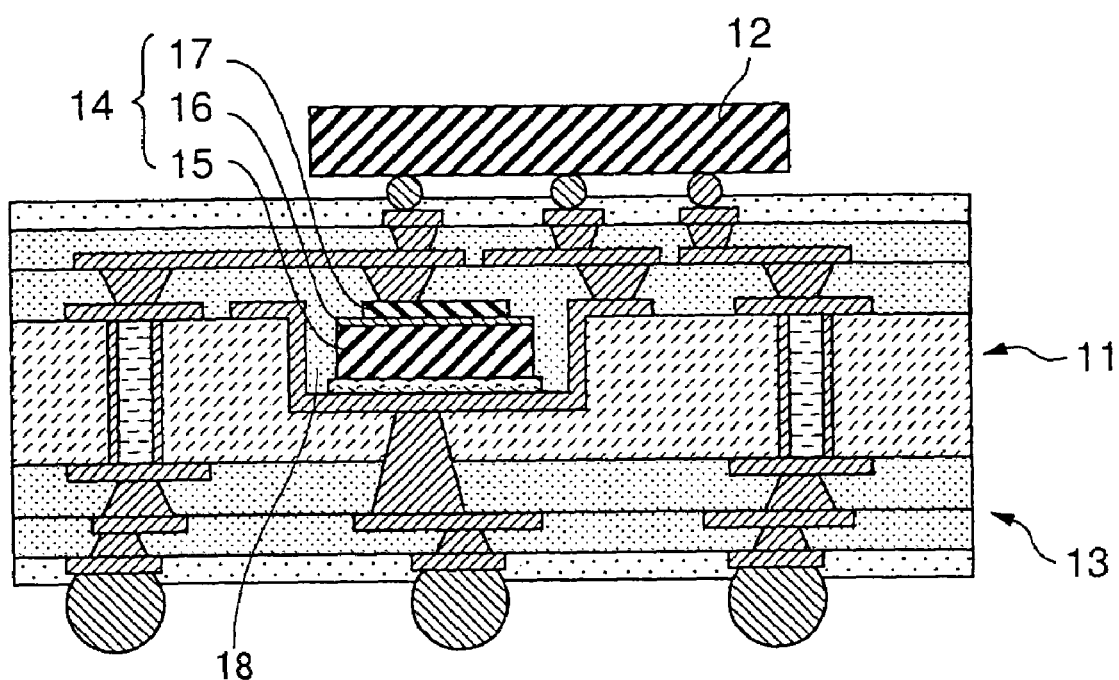
FIG. 9 is a diagram showing a semiconductor device according to a related art.

Referring to FIG. 8, it should be noted that the decoupling capacitor 50 has a sandwich structure in which a tantalum film 53 having an anode oxide layer 54 formed by the anode oxidation process of the tantalum film 53 is sandwiched by a copper electrode layer 51 and a copper electrode layer 52. Thereby, the electrode layer 51 is connected to the power feeding path 44 electrically while the electrode layer 52 is connected to the ground pat 45 electrically. Thus, the decoupling capacitor 50 is connected between the power feeding path 44 and the ground path 45. Thereby, the decoupling capacitor 50 absorbs the voltage change caused at the time the semiconductor device 20 is driven in the state mounted on the printed circuit board, and the supply voltage supplied to the semiconductor chip 60 is stabilized.

In the construction of FIG. 1, it should be noted that the decoupling capacitor 50 is provided between the insulation layer 32 and the insulation layer 33 immediately underneath the chip-mounting surface 36. Thus, the decoupling capacitor 50 is separated from the chip-mounting surface 36 merely by the thickness of the single insulation layer 33, and the distance a or distance b between the capacitor 50 and the semiconductor chip 60 is minimized. Thereby, the inductance between the capacitor 50 and the semiconductor chip 60 is similarly minimized, and the supply voltage to the semiconductor chip 60 is effectively stabilized even in the case the operational frequency of the semiconductor device is increased. Thus, the substrate 30 is suitable for carrying a semiconductor chip to be operated at high frequency.

It should be noted that the built-in capacitor 50 thus formed has a very small thickness and no substantial effect is caused on the thickness t1 of the substrate 30. In other words, the thickness t1 of the substrate 30 is held very small.

Next, manufacturing process of the substrate 30 will be explained with reference to FIGS. 3A–3G, 4A–4F and 5A–5D.

First, in the step of FIG. 5A, a layer 101 of organic polysilane is formed on a base 100.

The base 100 should be formed of a material that can be removed by etching after the substrate 30 is formed and should be able to withstand to the temperature of about 500° C. An example of the base 100 is a copper plate. Alternatively an iron plate may also be used. Further, the base 100 may be formed of silicon. In this case, the base 100 can be removed by polishing. Further, the base 100 may be an adhesive sheet that can be peeled. The organic polysilane layer 101 may be formed by a spin coating process with a thickness of 1—several ten microns. The organic polysilane layer thus formed is subsequently subjected to a pre-baking process at the temperature of 120° C. for 10 minutes.

It should be noted that the organic polysilane layer 101 thus formed on the base 100 can withstand the high temperature process, which is used at the time of forming the capacitor, in the state that the polysilahe layer 101 is baked. Thus, in the present invention, the high temperature process used for forming the capacitor can be conducted without problem.

Figure 3A:
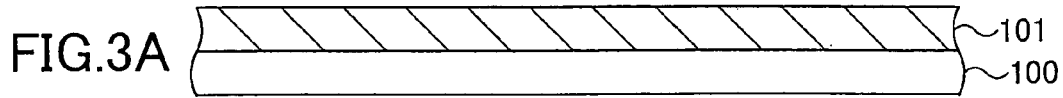
Figure 3B:
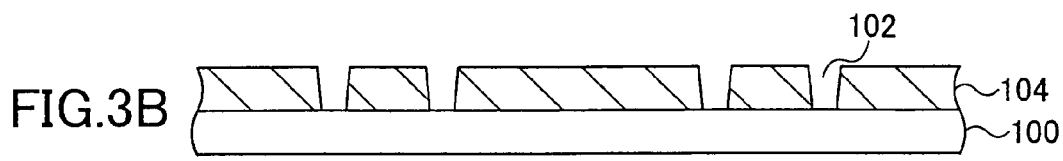

Next, as represented in FIG. 3B, the organic polysilane layer thus pre-baked is subjected to an exposure and developing process to form a via-opening 102 such that the via-opening 102 reaches the base 100, and the organic polysilane layer 101 thus formed with the via-opening 102 is subjected to a post-baking process. As a result of the post-baking process, the organic polysilane layer 101 is converted to a post-baked organic polysilane layer 104, and the post-baked organic polysilane layer 104 thus formed constitutes the insulation layer 33 explained before.

It should be noted that the foregoing exposure process is conducted with an exposure dose of $5J/cm^2$ at the wavelength of 310 nm and the developing is conducted in an alkaline developer. Further, the post-baking is conducted at 230° C. for 60 minutes.

The post-baked organic polysilane layer 104 thus obtained has a thermal expansion coefficient close to that of silicon. In the case the post-baking process is conducted at the temperature of 500° C. or more, the organic polysilane is fully converted to an inorganic film of $SiO_2$, which has a thermal expansion coefficient close to that of silicon forming the semiconductor chip. It should be noted that the foregoing "pre-baked organic polysilane layer" includes such a fully converted inorganic film formed by high-temperature post-baking process.

Figure 3C:
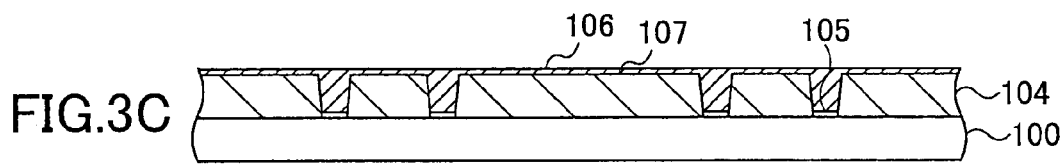

Next, in the step of FIG. 3C, an electrolytic gold plating process and an electrolytic nickel plating process are conducted to the surface of the base 100 exposed at the bottom of the via hole 102 to form a pad 105.

Next, a non-electrolytic plating process of copper is conducted to form a seed layer 106 of copper on the top surface of the post-baked organic polysilane layer 104, the top surface of the pad 105 and the sidewall surface of the opening 102. It should be noted that this seed layer 106 may also be formed by a sputtering of chromium, followed by sputtering of copper.

Next, an electrolytic plating process of copper is conducted while using the seed layer 106 as an electrode to form a metal layer 107 on the top surface of the post-baked organic polysilane layer 104, such that the metal layer 107 fills the via-opening 102.

Figure 3D:
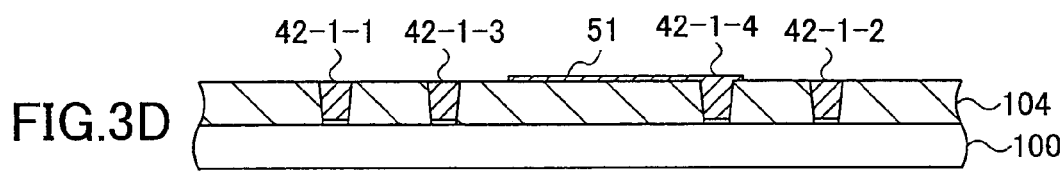

Next, as represented in FIG. 3D, the metal layer 107 is subjected to an etching process such that there are left via-plugs 42-1-1, 42-1-2, 42-1-3, 42-1-4, and further an electrode pattern 51.

Here, it should be noted that the formation of the electrode 51 is not limited to the foregoing subtract process but semi-subtract process or additive process may also be used.

Figure 3E:
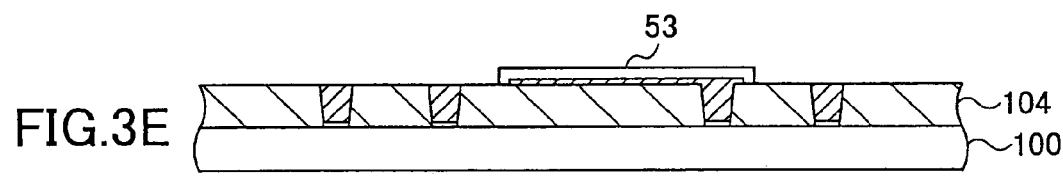

Next, as represented in FIG. 3E, a tantalum film 53 is formed selectively on the electrode 51 by a selective sputtering process. Alternatively, the tantalum film 53 may be formed by forming a tantalum film on the entire surface of the post-baked organic polysilane film 104 by a sputtering process, followed by a patterning process such that the tantalum film remains only on the electrode 51.

Figure 3F:
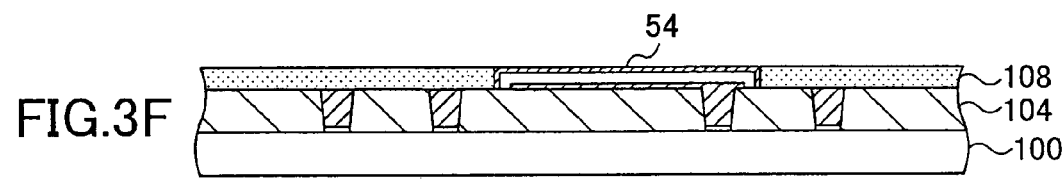

Next, as represented in FIG. 3F, the post-baked polysilane film 104 is covered with a resist film 108 except for the part where the tantalum film 53 is formed, and an anodization process is applied to the top surface of the tantalum film 53. With this, there is formed an anode oxide layer (dielectric layer) 54 is formed at the top part of the tantalum film 53. This anode oxide layer 54 forms the capacitor dielectric film.

Typically, the anodization process is conducted by using a solution of sodium citrate of 0.1% concentration for the electrolytic solution and the oxidation is conducted with a constant current of 1.0 $mA/cm^2$ until a formation voltage of 200V is reached.

Figure 3G:
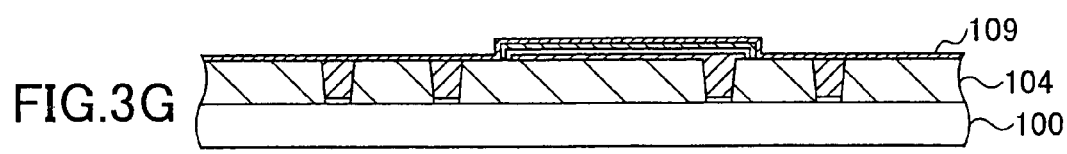

Next, as represented in FIG. 3G, a metal layer 109 is formed on the structure thus formed. Thereby, it should be noted that the formation of the metal layer 109 is conducted in the state the resist film 108 is removed. More specifically, a seed layer is formed on the surface thus exposed, and the metal layer 109 is formed by conducting an electroplating process of copper while using the seed layer thus formed as an electrode. Typically, this seed layer is formed by a non-electrolytic plating of copper but can also be formed by consecutive sputtering process of chromium and copper.

Next, as represented in FIG. 4A, the metal layer 109 is patterned by an etching process and the electrode 52 and the interconnection pattern 34 are formed as a result. With this, the decoupling capacitor 50 is formed. It should be noted that the interconnection pattern 34 is formed in correspondence to the via-plugs 42-1-1 and 42-1-2. Further, a resist pattern is formed and the part of the anode oxide layer 54 and the tantalum layer 53 corresponding to the via hole 42-1-4 is removed by etching. With this, there is formed an opening 110 exposing the top surface of the via hole 42-1-4.

Next, as represented in FIG. 4B, an epoxy resin is applied to the structure of FIG. 4A to form an epoxy resin layer 111.

In place of the epoxy resin layer 111, it is possible to use a polyamide film. Further, such a resin film can also be formed by laminating a resin sheet.

Next, as represented in FIG. 4C, a laser beam processing or etching is applied to form via-openings 112 in the epoxy resin film 111 such that the via-plugs 42-1-3 and 42-1-4 and the interconnection pattern 34 are exposed.

In the case a photosensitive resin film is used in place of the epoxy film 111, the openings 112 are formed by exposure and developing process.

Next, as represented in FIG. 4D, a metal layer 113 is formed on the surface of the epoxy resin film 111, such that the metal layer 113 fills the via-openings 112. Thereby, the metal layer 113 forms a seed layer at the surface of the epoxy resin film 111 and an electroplating process of copper is conducted while using the seed layer as an electrode. It should be noted that the seed layer may be formed by a non-electrolytic plating of copper or alternatively by sputtering of chromium and copper conducted consecutively.

Next, as represented in FIG. 4E, the metal layer 113 is etched to form via-plugs 42-2-1-42-2-4 and further an interconnection pattern, wherein it will be noted that the via-plugs 42-2-1 and 42-2 are connected electrically to the interconnection pattern 34, while the via-plugs 42-2-3 and 42-2-4 are connected respectively to the via-plugs 42-1-3 and 42-1-4.

By repeating the steps of FIGS. 4B-4E, there is formed a structure of FIG. 4F, in which it can be seen that there are further formed an epoxy resin film 114, via-plugs 42-3-1-42-3-4 and external connection pads 115 for external electrical connection. With this, there are formed the signal conduction paths 42 and 43, power feed path 44 and the ground path 45. Further, the structure thus formed is covered with a solder resist film 45 except for the part where the external connection pads 115 are formed, and the solder balls 46 are provided at the respective openings of the solder resist film 47 thus formed. The solder balls 46 are then subjected to a reflowing process and are connected to the external connection pads 115. It should be noted that the steps of FIGS. 4B–4E can be repeated plural times.

Next, as represented in FIG. 5A, the base 100 is removed by an etching process. With this, the bottom surface of the post-baked organic polysilane layer 104 is exposed and hence the pads 105. Thereby, the bottom surface becomes the chip-mounting surface 36 on which the signal terminals 38 and 39, the power terminal 40 and the ground terminals 41 are formed.

Thus, by removing the base 100 by an etching process, there is obtained a large-size layered body 120 that includes therein the areas each corresponding to a chip-mounting substrate 30 in a row and column formation. It should be noted that such a layered body 120 includes therein built-in capacitors 50 as explained before.

It should be noted that the etching may be conducted such that the base 100 remains in the form of a frame along the peripheral edges of the foregoing areas corresponding to the chip-mounting substrates 30, such that the frames provide reinforcement to the chip-mounting substrates 30.

Next, as represented in FIG. 5B, a temporal tacking tape 116 of relatively weak adhesion is provided on the foregoing layered body 120 at the side where the solder resist film 47 is formed, and the layered body 120 is diced along a scribe line 117 from the side thereof opposite to the side where the tape 116 is provided, such that the scribe line 117 reaches the temporal tacking tape 116. Thereby, the scribe lines 117 are formed in rows and columns, and the layered body 120 is divided into a number of pieces each forming a chip-mounting substrate 30. Because of the existence of the temporal tacking tape 116, the chip-mounting substrates 30 thus formed are held at the respective positions and mixing up of the individual chip-mounting substrates 30 is avoided.

When mounting a chip 60, a substrate 30 is picked up from the tape 116 as represented in FIG. 5D, and the chip 60 is flip chip mounted on the surface where the pads 105 are formed.

Next, a variation of the chip-mounting surface 36 will be described.

Figure 6A:
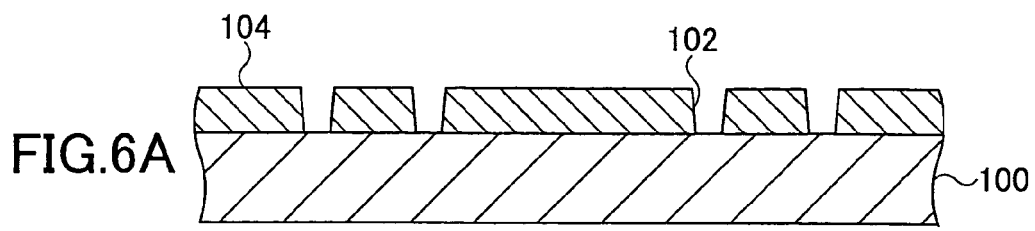
FIGS. 6A–6E are diagrams showing a modification of the first embodiment.
Figure 6B:
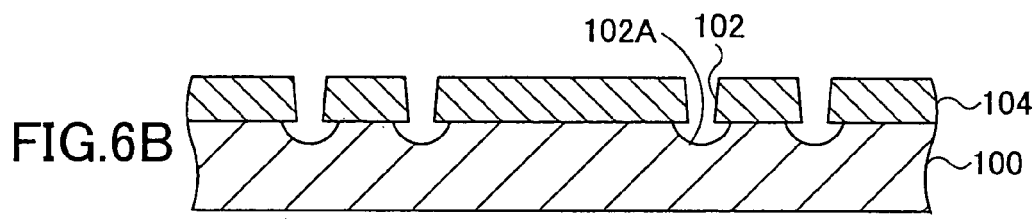
Figure 6C:
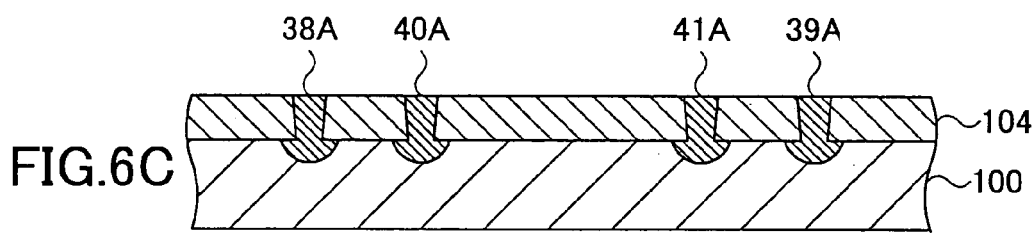
Figure 6D:
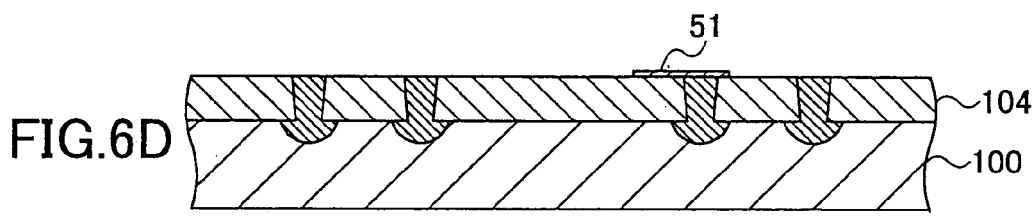
Figure 6E:
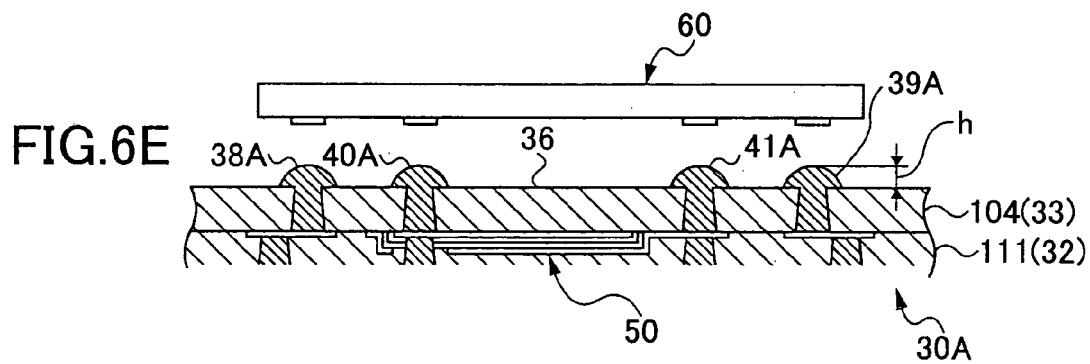

FIG. 6E shows the terminal structure of the chip-mounting surface 36 of a chip-mounting substrate 30A according to a modification of the present invention together with the semiconductor chip 60 to be mounted on the substrate 30A.

Referring to FIG. 6E, it can se seen that the chip-mounting substrate 30A includes signal terminals 38A and 39A, a power terminal 40A and a ground terminal 41A respectively in correspondence to the signal terminals 38 and 39, the power terminal 40 and the ground terminal 41, wherein the terminals 38A, 39A, 40A and 41A are formed of a solder bump. Thereby, the terminals 38A, 39A, 40A and 41A are formed so as to project from the plane of the chip-mounting surface 36 with a height h, and thus, there is no need of forming a bump on the side of the semiconductor chip 60 to be mounted.

It should be noted that the semiconductor device in which the semiconductor chip 60 is mounted on the chip-mounting substrate 30A, has an advantageous feature in that, because of the construction of the terminals 38A, 39A, 40A and 41A projecting from the chip-mounting surface 36, the thermal stress occurring between the semiconductor chip 60 and the chip-mounting substrate 30A is effectively reduced as compared with the semiconductor device 20 shown in FIG. 1, in addition to the advantageous feature that the chip-mounting surface 36, on which the semiconductor chip 60 is mounted, is formed of the post-baked organic polysilane layer 104 having a thermal expansion coefficient close to that of the semiconductor chip 60. Thereby, the semiconductor device has excellent reliability.

FIGS. 6A–6E show the process of forming the terminals 38A–41A of the chip-mounting substrate 30A, wherein FIGS. 6A–6D respectively correspond to FIGS. 3A–3D while FIG. 6E corresponds to FIG. 5A.

First, an etching process is conducted to the organic polysilane layer 104 formed already with the via-openings 102 to form corresponding depressions 102A in the copper base 100 as represented in FIG. 6B. Thereby, it should be noted that each depression 102A extends laterally under the post-baked organic polysilane layer 104 beyond the via-openings 102.

Next, a solder plating process is conducted while using the copper base 100 as an electrode, and the solder alloy filling the foregoing via-openings 102 form via-plugs functioning as the signal terminals 38A and 39A, the power terminal 40A and the ground terminal 41A as represented in FIG. 6C.

Next, as represented in FIG. 6D, an electrode 51 is provided on the post-baked organic polysilane layer 104 in electrical connection with the ground terminal 41A.

Thereafter, the process steps similar to the process steps of FIGS. 3E–3G and FIGS. 4A–4F are conducted to form the layered body having a built-in capacitor similarly to the layered body 120. By removing the copper base 100 by an etching process, the structure of FIG. 6E is obtained, in which the signal terminals 38A and 39A, power terminal 40A and the ground terminal 41A form a plug projecting from the chip-mounting surface 36 as explained before.

In the present embodiment, it is also possible to divide the layered body 120 upon etching removal of the base 100, without conducting a separate dicing process, by forming the grooves along the dicing line 117 in rows and columns in the layered body 120 in advance such that the grooves extend through the organic polysilane layer 104 and the epoxy resin films 111 and 114.

[Second Embodiment]

Figure 7:
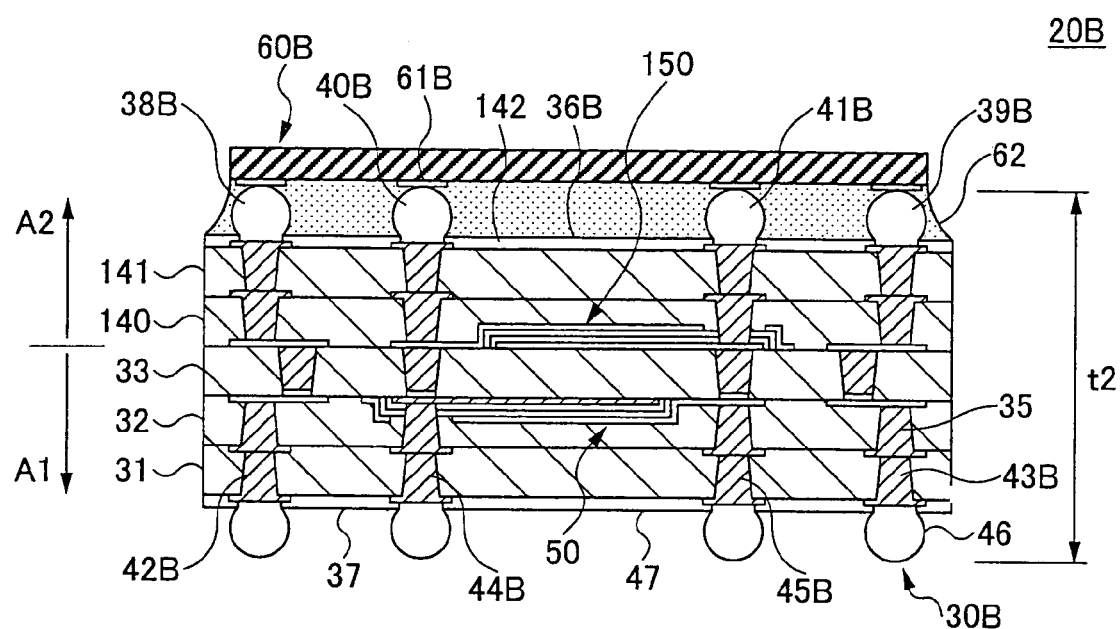
FIG. 7 is a diagram showing the construction of a semiconductor device according to a second embodiment of the present invention.

FIG. 7 shows a semiconductor device 20B according to a second embodiment of the present invention.

Referring to FIG. 7, the semiconductor device 20B has a construction similar to the semiconductor device 20 of FIG. 1 except that a chip-mounting substrate 30B is used in place of the chip-mounting substrate 30. In FIG. 7, those parts corresponding to the parts described previously are designated by the same reference numerals added with a suffix B.

As will be explained later, the chip-mounting substrate 30B is a multilayer circuit substrate formed by a both-side buildup method and thus includes, in addition to the insulation layers 33, 32 and 31 built up in the A1 direction, insulation layers 140 and 141 that are built up in the A2 direction. The chip-mounting substrate 30B has a chip-mounting surface 36B at the top side thereof and a mounting surface 37 at the bottom surface thereof.

Similarly as before, the decoupling capacitor 50 is formed between the insulation layer 32 and the insulation layer 33, wherein the capacitor 50 is formed during the buildup process in the A1 direction after the step of formation of the insulation layer 33 but before the step of formation of the insulation layer 32.

In the present embodiment, it can be seen that there is formed another built-in capacitor 150 in the chip-mounting substrate 30B between the insulation layer 33 and the insulation layer 140, wherein the capacitor 150 has a construction identical with the construction of the capacitor 50 and is formed during the buildup process in the A2 direction after the step of forming the insulation layer 33 but before the step of forming the insulation layer 140. Thereby, it should be noted that the capacitor 50 and the capacitor 150 are connected parallel with each other between the power feed path 44B and the ground path 45B. Thereby, the capacitor 50 and the capacitor 150 form together a decoupling capacitor of large capacitance, and the voltage supplied to the semiconductor chip 60B is effectively stabilized.

In the present embodiment, it should be noted that the chip-mounting surface 36B carries thereon the signal terminals 38B and 39B, the power terminal 40B and the ground terminal 41B and is covered with a solder resist film 142. On the other hand, the device mounting surface 37 is covered with a solder resist film 47 and carries the solder balls 36 thereon.

It should be noted that the semiconductor device 20B is a ball-grid type device and the semiconductor chip 60B is flip-chip mounted on the chip-mounting surface 36B via the terminals 61B and is adhered to the chip-mounting substrate 30B by the underfill resin 62.

The insulation layer 33 is formed by pre-baking and post-baking a layer of an organic polysilane. Typically, polymethylphenyl silane is used for the organic polysilane. On the other hand, the other insulation layers 31, 32, 140 and 141 are formed of an epoxy resin film.

It should be noted that the built-in capacitors 50 and 150 are formed immediately underneath the chip-mounting surface 36B in the vicinity of the surface 36B, and thus, the distance from the semiconductor chip 60B to the capacitor 50 or 150 is minimized. Associated with this construction, inductance between the semiconductor chip 60B and the capacitor 50 or 150 is also minimized. Thus, a stable supply voltage is supplied to the semiconductor chip 60B in the semiconductor device 20B of the present embodiment.

Because the built-in capacitors 50 and 150 have a very small thickness, the capacitors 50 and 150 provide no substantial effect on the thickness t2 of the chip-mounting substrate 30B, and the thickness t2 can be minimized.

Next, manufacturing process of the chip-mounting substrate 30B will be explained with reference to FIGS. 8A–8G and FIG. 9.

First, a build-up process is conducted in the A1 direction.

Thus, in the step of FIG. 8A, an organic polysilane is applied to the top surface of the copper base 100. By conducting a pre-baking process to the layer thus applied, the organic polysilane layer 101 is formed.

Next, in the step of FIG. 8B, the organic polysilane layer 101 thus formed is subjected to a patterning process to form the via-openings 102. As the same time, a groove 200 is formed in the layer 101 in a grid-shape, wherein the groove 200 is used later at the time of separating the chip-mounting substrates 30B from each other.

Further, the layer 101 of organic polysilane is subjected to a post baking process, and the layer 101 is converted to the post-baked polysilane layer 104. This layer 104 constitutes the insulation layer 33.

Next, a non-electrolytic plating process and an electrolytic plating process of copper are applied to the top surface of the structure of FIG. 8B in the step of FIG. 8C, and there is formed a copper layer 201 on the post-baked organic polysilane layer 104 such that the copper layer 201 fills the via-openings 102 and the grooves 200. With this, copper via-plugs 202 are formed in the via-openings 102 and a copper grid 203 are formed in the grid-shaped grooves 201. It should be noted that the copper grid 203 connects the chip-mounting substrates 30 formed together on the base 100.

Next, as represented in FIG. 8D, the copper base 100 is removed and a copper layer 205 is formed on the exposed bottom surface of the post-baked organic polysilane layer 104 by conducting a non-electrolytic plating process and an electrolytic plating process of copper consecutively.

Next, both of the copper layers 201 and 205 are patterned simultaneously and the electrodes 51 and 151 are formed as represented in FIG. 8E. Further, by conducting the process steps explained with reference to FIGS. 3E–3G, the capacitors 50 and 150 are formed as represented in FIG. 8F.

Further, the build-up process is conducted both in the A1 direction and in the A2 direction by conducting the process steps explained with reference to FIGS. 4A–4F, and a layered body 120B shown in FIG. 8G is obtained. In the layered body 120B, there are formed a number of areas 30C each corresponding to a chip-mounting substrate 30B in the manner that the area 30C is surrounded by the grid-shaped grooves 212 and 213 at the top side and bottom side of the layer 104. Thereby, the areas 30C are connected with each other by the copper grid 203 formed in correspondence to the grid-shaped groove 200.

Finally, the copper grid 203 is removed by an etching process, and the layered body 120B is divided into a number of chip-mounting substrates 30B.

Figure 2:
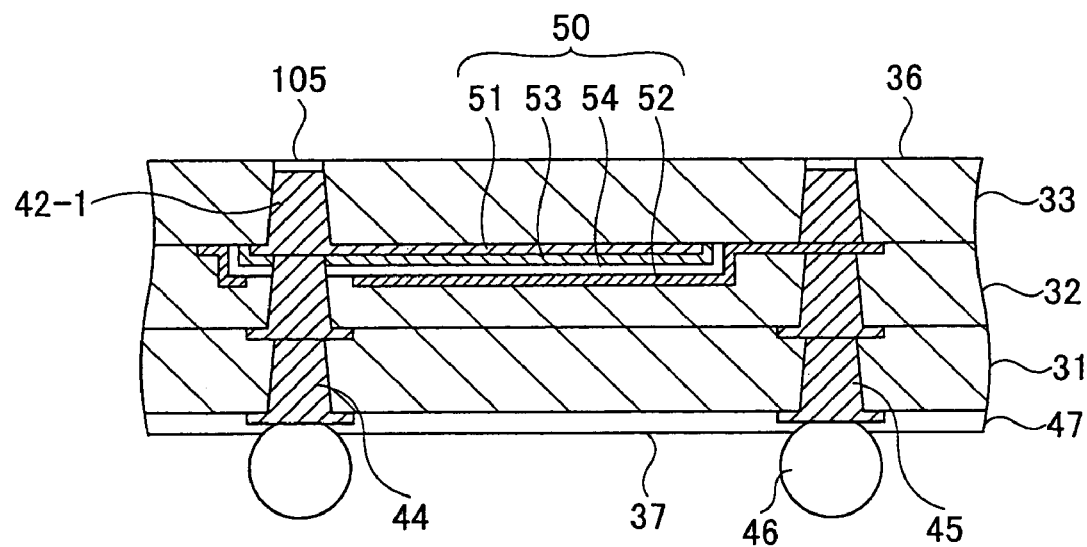
FIG. 2 is a diagram showing a part of FIG. 1 with an enlarged scale.

In the substrate 30 of FIG. 2 or substrate 30B of FIG. 7, it should be noted that the dielectric film of the capacitor 50 or 150 can be formed by a method other than the anodization process. For example, the dielectric film may be formed of a ferroelectric film such as a barium titanate film or a strontium titanate film formed by a PVD process or CVD process. Alternatively, the dielectric film may be formed by a sol-gel process.

Further, it is possible to use a liquid crystal polymer for the layer 33 in the construction of FIG. 2 or FIG. 7 in place of organic polysilane.

Further, it is possible to form a built-in resistor by providing an anode oxidation layer or a ferroelectric layer in the interconnection pattern. As noted previously, it is possible to use a liquid crystal polymer in place of organic polysilane.

Further, the present invention is not limited to the embodiments described heretofore but various variations and modifications may be made without departing from the scope of the invention.

What is claimed is:

1. A substrate to be mounted with a semiconductor chip, comprising:
    a plurality of insulation layers forming a laminated structure, said laminated structure having a chip-mounted surface in which a semiconductor chip is mounted; and
    a built-in capacitor formed in said laminated structure, said built-in capacitor being integrated with said laminated structure and being formed on a layer of organic polysilane in said substrate, said built-in capacitor comprising:
        a dielectric film; and
        a pair of electrode layers sandwiching said dielectric film.

2. The substrate as claimed in claim 1, wherein said insulation layer forming said chip-mounting surface is formed of a baked organic polysilane layer.

3. The substrate as claimed in claim 2, wherein said baked organic polysilane layer comprises a baked polymethylphenyl silane layer.

4. The substrate as claimed in claim 2, wherein said baked organic polysilane layer has a silicon skeleton and an organic substituent at a said chain of said skeleton.

5. The substrate as claimed in claim 2, wherein said baked organic polysilane layer has a thermal expansion coefficient of about 2.6 ppm/K at said mounting surface.

6. The substrate as claimed in claim 2, wherein said baked organic polysilane layer has a Young modulus of about 1.2 GPa.

7. The substrate as claimed in claim 2, wherein said baked organic polysilane layer has a dielectric loss tangent of about 0.005.

8. The substrate as claimed in claim 2, wherein said baked organic polysilane is baked at a temperature of 230° C. or higher.

9. The substrate as claimed in claim 1, wherein said substrate includes power feeding conductor and a ground conductor and wherein said built-in capacitor is provided in electrical connection between said ground conductor and said power feeding conductor.

10. The substrate as claimed in claim 9, wherein each of said power feeding conductor and said ground conductor extends continuously from a bottom surface of said substrate to a top surface of said substrate along a via-hole.

11. The substrate as claimed in claim 10, wherein each of said power feeding conductor and said ground conductor has a projecting part projecting from said chip-mounting surface.

12. The substrates as claimed in claim 11, wherein said projecting part extends laterally beyond a diameter of said via-hole along said chip-mounting substrate.

13. The substrate as claimed in claim 11, wherein said projecting part has a rounded shape and extends laterally beyond a diameter of said via-hole in intimate contact with said chip-mounting surface.

14. The substrate as claimed in claim 1, wherein said capacitor is formed between a first insulation layer and a second insulation layer formed on said first insulation layer in intimate contact with both of said first and second insulation layers, said first and second insulation layers being included in said plural insulation layers, one of said first and second insulation layers providing a said chip-mounting surface and being formed of a baked organic polysilane layer.

15. A substrate to be mounted with a semiconductor chip, comprising:
    a plurality of insulation layers forming a laminated structure, said laminated structure having a chip-mounted surface on which a semiconductor chip is mounted; and
    first and second built-in capacitors each formed in said laminated structure at a first side and a second side of an insulation layer formed of a baked organic polysilane layer, each of said first and second built-in capacitors being integrated with said laminated structure,
    each of said first and second built-in capacitors comprising a dielectric film and a pair of electrode layers sandwiching said dielectric film,
    said first and second built-in capacitors being connected parallel with each other between a power feed path and a ground path extending continuously through said substrate from a bottom surface thereof to a top surface thereof.

* * * * *